United States Patent [19]

Richter et al.

[11] Patent Number: 4,931,944
[45] Date of Patent: Jun. 5, 1990

[54] METHOD OF OPTIMIZING A VEHICLE ASSEMBLY LINE BUILD SEQUENCE

[75] Inventors: Roy Richter, Ann Arbor; Jackson G. Gay, Birmingham; Robert P. Kromer, Royal Oak, all of Mich.

[73] Assignee: General Motors Corporation, Detroit, Mich.

[21] Appl. No.: 434,536

[22] Filed: Nov. 8, 1989

Related U.S. Application Data

[63] Continuation of Ser. No. 199,696, May 27, 1988, abandoned.

[51] Int. Cl.⁵ .............................................. G06F 15/00
[52] U.S. Cl. .................................... 364/468; 264/300; 264/512
[58] Field of Search ................................ 364/400–403, 364/468, 478, 512, 300

[56]  References Cited

U.S. PATENT DOCUMENTS

| | | | |
|---|---|---|---|
| 4,495,559 | 1/1985 | Galatt, Jr. et al. | 364/300 |
| 4,593,360 | 6/1986 | Cocks | 364/468 |
| 4,688,178 | 8/1987 | Connelly et al. | 364/403 |
| 4,745,549 | 5/1988 | Hashimoto | 364/402 |
| 4,745,555 | 5/1988 | Connelly et al. | 364/403 |

Primary Examiner—Allen MacDonald
Attorney, Agent, or Firm—Albert F. Duke

[57]  ABSTRACT

A method of scheduling the building sequence of a plurality of objects on an assembly line in order to minimze the cost of building the objects is disclosed. Each object has a plurality of attributes, which together with the position of the object in the sequence, affects the overall cost of the build sequence. A computer is provided with a representation of the object, its attributes, and a procedure for calculating the cost associated with any arrangement of the attributes. An initial build sequence is generated using the representation which has a minimal cost associated with the arrangement of at least one of the attributes. A final build sequence is generated in accordance with a simulated annealing algorithm which utilizes a scoring function that includes the costs defined by the procedure, those costs associated with the attributes being independently weighted in accordance with a temperature varying function. A representation of the final build sequence usable for construction of the object is then provided.

5 Claims, 8 Drawing Sheets

CODE

B=BIG BLACK                    b=little black

W=BIG WHITE                    w=little white
   (none in this run)
         BUILD SEQUENCE(left to right)

w w w w w w w w w w w w w B B b B B b B b B B b b b b (COLOR OPTIMUM)

B b w w B b w w B b w w B b W W B b w w B b w w B b w w (SIZE OPTIMUM)

w w w w w w w w w w w w w w B b B b B b B b B b b B b (GLOBAL OPTIMUM-SIZE & COLOR)

w w B w w w B w w w w w w w w B b b B b B b b B b B b (LIKELY SIMULATED ANNEALING RESULT)

METHOD OF OPTIMIZING A VEHICLE ASSEMBLY LINE BUILD SEQUENCE

This is a continuation of application Ser. No. 199,696 filed on May 27, 1988 now abandoned.

FIELD OF THE INVENTION

This invention relates to methods of optimizing the arrangement of objects to decrease the cost of production, and more particularly to a vehicle build sequence optimization method utilizing an improved simulated annealing technique.

BACKGROUND OF THE INVENTION

The order in which vehicles or other products are built on an assembly line greatly influence the total production cost of the product. There are costs that favor grouping certain options and those that favor spacing others. For example, paint color is an option that will tend to group cars. There is a cost associated with painting consecutive cars different colors that is derived from purging the sprayer nozzle of paint. Another possible cost is the decrease in quality that occurs when colors are changed, due to paint in the air settling on the wrong car. Assuming all cars are of high quality after leaving the paint operation, this would then imply a cost to repaint the car. Two adjacent cars will have a paint cost that is lower if they have the same color than if they have different colors. The cost is however non-symmetric: That is, a white car followed by a black car would have a lower cost than a black car followed by a white car, since it is easier to purge white paint with black paint than vice-versa.

With respect to spacing considerations, an eight-cylinder engine is a good example of an attribute that will suggest that certain cars be spaced far apart during assembly. It takes more time to install an eight-cylinder engine that it does to install a four-or-six-cylinder engine. Thus, it is desirable to leave the maximal space between occurrences of this option. If ten percent of orders have eight-cylinder engines, the best one can do is to space the ones containing these engines every ten cars. Spacing some farther than this will cause others to be spaced closer. If the option is spaced closer than the average, then workers may be rushed. If they are spaced farther apart than the average, there may be idle capacity. Hence there is a cost that is minimum at the average spacing and increases when any spacing deviates from this. The tighter the distribution of spacings cluster around the average, the lower the total cost will be.

Simulated annealing is a randomized local search method for finding near optimum solutions to combinatorial optimization problems and has been discussed extensively in the literature. See for example Optimization by Simulated Annealing by S. Kirkpatrick, C. D. Gelatt, and M. P. Vecchi, Science Volume 220, Page 671-680. The method is particularly applicable to problems where the number of possible solutions is extremely large and there is no efficient way to examine each possible solution. In U.S. Pat. No. 4,495,559 simulated annealing is applied to the problem of integrated circuit placement and layout.

Simulated annealing finds a minimum of an objective function $$O(x) = \sum_i O_i(x) \qquad (1)$$

where the symbol x represents the set of variables which completely specify the configuration of the objects which compose the combinatorial problem. Each term (labeled by i), called an objective, in Eq. 1 is associated with some attribute of the configuration and is designed to decrease when the configuration possesses a desired arrangement of that attribute.

Simulated annealing searches out a minimum of Eq. 1 by making a series of successive changes from some starting configuration. Let DELTA x be such a change and DELTA $0=0(x +\text{DELTA } x)-0(x)$ the corresponding change in $0(x)$. If DELTA 0 is negative, simulated annealing accepts the changed configuration. If DELTA 0 is positive, simulated annealing accepts the changed configuration with probability $$P = \exp(-\text{DELTA } 0/T), \qquad (2)$$

where T is a parameter, called the temperature, which changes during the course of the simulated annealing run according to an annealing schedule. A possible schedule is shown in FIG. 1. Essential properties of an annealing schedule are that the temperature be "high" for some period at the beginning of the schedule and decrease to a "low" value at the end. During the high part of the schedule, simulated annealing accepts many unfavorable changes and thus explores many configurations. As the temperature decreases the method is designed to settle into a minimum of $0(x)$. If the run is long enough and the cooling slow enough, it can be proved that simulated annealing will find the absolute minimum of $0(x)$.

The difficulty with simulated annealing is that with some problems so much computer time is required that the method is not practical for such problems. Run time can be unacceptably long when some of the desired configurations conflict with one another, i.e., when a change which decreases one of the terms of Eq. 1 almost always increases another.

BRIEF DESCRIPTION OF THE INVENTION

The present invention is particularly useful when the following conditions exist:

1. One or more of the objectives making up the objective function, hereinafter referred to as "special" objectives, can be mimimized using some constructive algorithm or recipe.

2. A configuration that is near optimum for these special objectives in conjunction with an near optimum for the remaining objectives is found only after an unacceptable amount of computer time by the random process of simulated annealing.

3. A configuration, such as given in (2) will be altered with high probability by the random process of simulated annealing.

In accordance with the present invention a constructive algorithm is used to select a configuration which minimizes the special objectives that satisfy the three conditions mentioned above. If there is more than one special objective, it must be true that the objectives do not conflict strongly. This initial step is designated the preplacement step. Starting from this initial configuration, simulated annealing is used with a new temperature dependent objective function, $$Q(x,T) = \sum_i F_i(T)O_i(x) + \sum_j O_j(x) \quad (3)$$

In Eq. 3, the first sum is over the terms corresponding to the objectives satisfied by the preplacement (i), and the second sum is over the remainder (j). $F_i(T)$ is varied with T so that it initially starts at a value high enough to prevent changes in the corresponding (i) objective functions and ends at a value of 1. The value of $F_i$ should remain large while the objectives j are optimized. After the value of the objective functions j have plateaued, $F_i(T)$ can be dropped to the final value of 1. Varying $F_i(T)$ in this manner retains the advantageous information given in the preplacement step for objectives i while optimization progresses over objectives j and allowing further optimization of the objectives i.

The method of the present invention is faster than standard simulated annealing since: Condition (2) holds, and thus much time would be spent finding the optimum configuration, while condition (1) provides a quick way of finding it; and Eq. 3 is used to defeat the drawback of condition (3).

BRIEF DESCRIPTION OF THE DRAWINGS

A more complete understanding of the invention may be had from the following detailed description of the invention which should be read in conjunction with the drawing in which:

FIG. 2.1 plots this variation with T, while FIG. 2.2 plots this variation with the number of attempted changes.

DETAILED DESCRIPTION OF THE INVENTION

Figures 3A, 3B, 3C, 3D, 4:
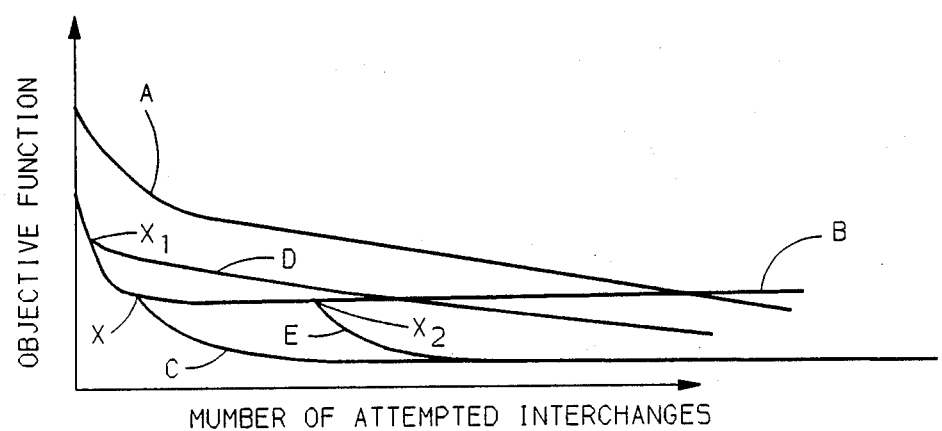
FIGS. 3a, 3b, 3c and 3d are four configuration designed to show the usefulness of the application of the invention to a particular scheduling problem.
FIG. 4 shows the progress of the optimization with and without the application of the invention.

A simple example will demonstrate the power of the method of the present invention. Assume an object such as a vehicle with two attributes, color and size or another attribute which affects the complexity of the build of the vehicle. Assume that these vehicles are built in a sequential fashion on an assembly line. The only two colors are white and black, and the only two sizes are big and small. In order to build these objects cheaply, it is desirable to build all objects of the same color together in order to reduce the amount of paint used. An optimum configuration for the color objective would thus be all white objects followed by all black objects as shown in FIG. 3a. Big objects take more time to build then little ones so it is desirable to space the big objects apart from each other to reduce manpower requirements and improve quality. In addition, they must be at least one unit apart. An optimum configuration for the size objective is shown in FIG. 3b. The complication occurs when both objectives are desired simultaneously, and all the big cars are black; then it is difficult to both group and space together. If the penalty for switching colors is less than the penalty for spacing the large objects with one small one between, then the optimum configuration would be FIG. 3c. The difficulty is how to arrive at this configuration in an efficient manner.

In the standard simulated annealing method, the most likely final configurations look like FIG. 3d. That is, there are many big, black objects in the white area. The big objects must be spaced out very well in the black area to allow room for all of them. It is very difficult using simulated annealing, due to its random nature, to progress from FIG. 3d to FIG. 3c.

Conditions (1-3) mentioned above are met for this application of the invention:

(1) The attribute to preplace is color; a simple constructive algorithm will place the white objects together and the black objects together.

(2) The optimum configuration (FIG. 3c) is not very likely to be found at random, since it requires a long-range structure in both the size and color attribute. This is not to say that it won't be found; it is merely unlikely or will require an unacceptably large amount of computer time.

(3) Given a configuration close to this optimum configuration, the standard simulated annealing method will move quickly away from the optimum by moving the big objects into the white area rather than spacing them out in the black area. Such moves are always accepted since they result in a decrease in the total objective function.

Figure 1:
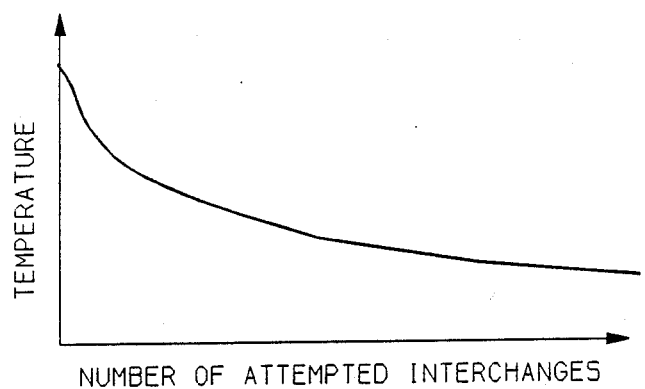
FIG. 1 is an example of an annealing schedule, i.e. the variation of T with the number of attempted changes.
Figure 2A:
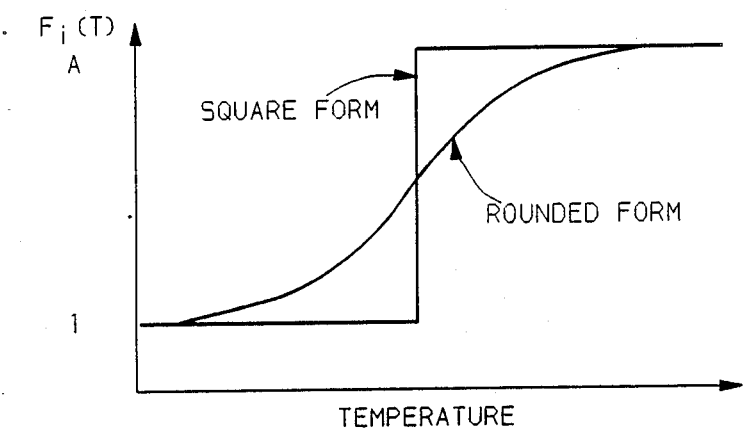
FIGS. 2a and 2b are examples of a variation of the temperature scaling of the objective function.
Figure 2B:
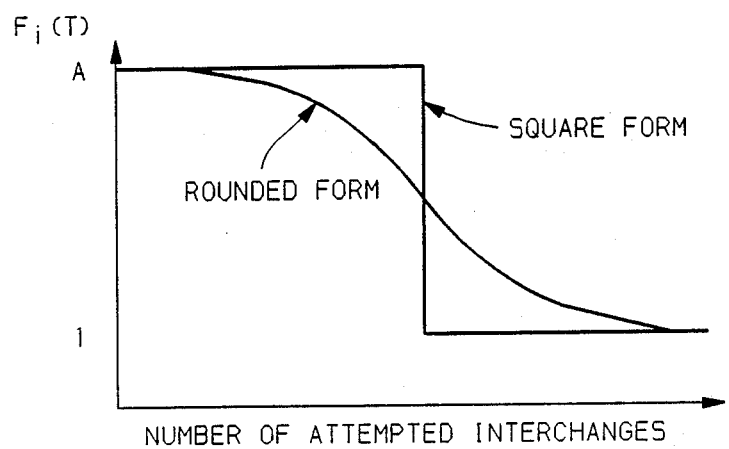

In general the steps of the invention are to first, assign the attribute COLOR to set i for preplacement and assign the attribute SIZE to set j for later consideration. Second, produce an initial configuration by placing all white objects ahead of the black objects. Third, construct an appropriate $F_i(T)$ to prevent the color preplacement from being destroyed until most of the size objective has been satisfied. The square function in FIG. 2a shows a good example of the $F_i(T)$ for this case. Fourth, simulated annealing is performed with the objective function in Eq. 3. This will force the configuration to space out the big objects in the black region first; when the drop in $F_i(T)$ occurs, most (if not all) of the size objective will be satisfied and the color objective will only be slightly degraded, ending up in the configuration given in FIG. 3c.

By observing the objective function, the point at which $F_i(T)$ should drop from a large to a small value may be determined. The usual progress of the minimization of the actual ($F_i(T) = 1$) objective function schematically follows the curve shown in FIG. 4. While the actual objective function drops, $F_i(T)$ is kept large. When it plateaus (Point X in FIG. 4) $F_i(T)$ is dropped to 1. Curve A is the one the actual objective function follows for the standard method. Curve B is the one followed if $F_i(T)$ is kept large. Curve C is the one followed when $F_i(T)$ is dropped to 1.; the crossover from curve B to C occurs at point X. If X is too early ($X_1$), then curve D is followed. This is inefficient; curve D turns into curve A if X is early enough. If X is too late, then curve E is followed. This is also inefficient, since time was spent not doing anything constructive from X to $X_2$. One may thus pick X by using these observations. X may be picked automatically, but for similar sets of constraints X is usually the same value within a few percent, so it may be fixed for successive runs on similar problems without incurring inefficiency.

The total amount of computer resources used in the present invention is far less than that used in standard simulated annealing, which will remain in configurations similar to FIG. 3.4 for almost all of the computer run.

As previously indicated, the invention is particularly useful in the optimization of the sequence in which objects are assembled on an assembly line. For example, the objects may be vehicles or any of the various subassemblies that comprise a vehicle, such as an engine.

This optimization in accordance with the invention provides an objective function comprising two parts. The two parts compete with each other in that a configuration optimal for one is not optimal for the other. The two parts of the objective function are first, color, where it is desirable to minimize the number of switches from a color to a different color as the objects progress down the assembly line; and second, size, where it is desirable to maximize the time, or distance, between two objects with a large size attribute. In order to be in conflict, near spacings of objects with the size objective must entail a larger penalty than a color change, and far spacings of objects with the size objective must entail a smaller penalty than a color change; in addition, the objects must have a larger percentage of the large size attribute in one or the other color.

In accordance with the invention the optimization further provides a quick constructive method of attaining one of the objectives. In the example this involves placing those objects with one color first, another color second, and so on. This initial configuration is such that it will be altered with a probability nearly one by the random actions of swapping objects, central to the simulated annealing process, since a move that separates two objects of large size attribute that are close to each other will result in a decrease in the objective function, despite the addition of a penalty due to changing the color. This results from the fact that a decrease in the objective function is always accepted by simulated annealing.

The optimization method of the present invention further provides a method of varying the weights of the part of the objective function corresponding to the attribute that was preplaced. The weighting factor is varied via the function $F(T)=1+A/(1+\exp((T_{mid}-T)/scale))$ where $A$ is set to a number larger than ten times the largest term in the objective function; and $T_{mid}$ is set to a number determined via several trials to minimize the CPU time required for a sample problem, as described above in connection with FIG. 4. Scale is set to a sufficiently small value that the transition in F from $1+A$ to 1 occurs in a narrow range; setting scale to $10^{-20}$ is usually sufficient, but other values of scale will possibly better or worse efficiency; trial and error, as in the case of $T_{mid}$, will determine the best value.

The criteria for the application of the simulated annealing algorithm is satisfied by introducing: first, a method of defining a sequence, by giving a list of positions in which to build the objects; second, a method of scoring the configuration, by using the objective functions mentioned above; third, generating new configurations, by swapping pairs of objects; fourth, providing a means of accepting the new configuration, by using the well-known exponential acceptance criterion; fifth, varying the acceptance criterion in an incremental fashion by using the well-known method of changing the temperature parameter T in an exponential fashion.

A more detailed understanding of a preferred embodiment of the invention may be had with reference to the flow chart of FIGS. 5-14 and the FORTRAN Program of APPENDIX A.

Figure 5:
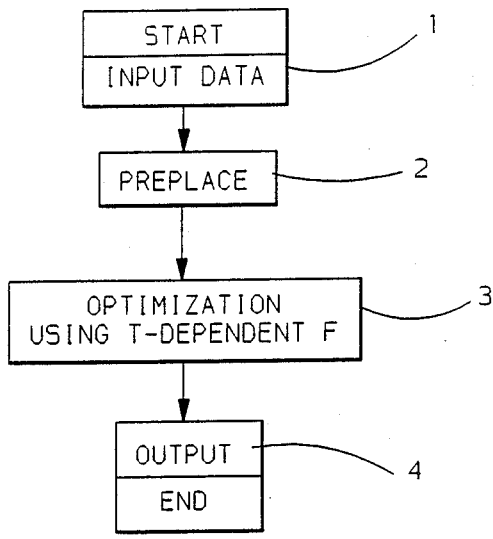
FIG. 5 is a block flowchart of a sequencing optimization.

Referring initially to FIG. 5, which depicts the overall process which involves first, as indicated in block 1, gathering the data describing the current system, second, as indicated in block 2, preplacing the objects in order to minimize the color attribute, as set forth in the quick constructive method; third, as indicated in block 3, performing an optimization run using the well-known method of simulated annealing except that the scoring function weights the preplaced attribute with the temperature-varying function F as given above, and fourth, as indicated in block 4, outputting the final configuration to a form usable subsequently.

Figure 6:
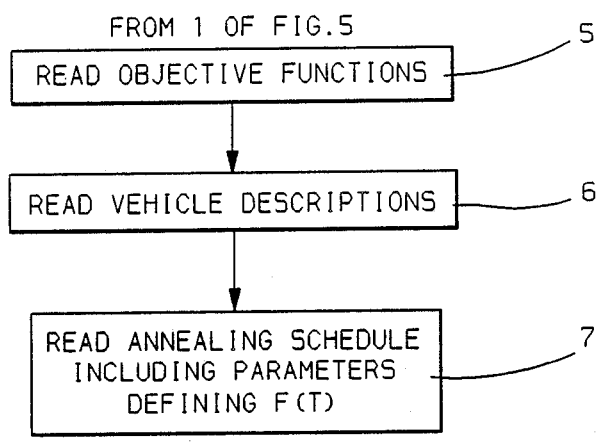
FIGS. 6 through 14 are individual elements of the flow chart.

Referring next to FIG. 6, a detailed description of block 1 of FIG. 5 is provided. There are three general steps in the input of data labeled 5 through 7. The first step labeled 5 involves the reading in of the objective functions from a file. These objective functions will be used in calculating the scoring that determines the improvement of the sequence.

In step 6, the second step, the descriptions of the objects or vehicles are read in from a file. These descriptions include a unique identifier for each object, the color of the object, and the size attribute of the object. The unique identifier will be used to assign the object to a specific position in the sequence. The two attributes, color and size, will be used to calculate the value of the objective function for a given sequence.

In step 7, the third step, parameters defining the annealing schedule and the parameters defining the variation of F with the annealing schedule are read in from a file. The annealing schedule defines the variation of the parameter T with the progress of the program; T is used to decide the conditional acceptance of a change in accordance with the well-know simulated annealing expression. The parameters defining F determine the variation of F with the parameter T.

Figure 7:
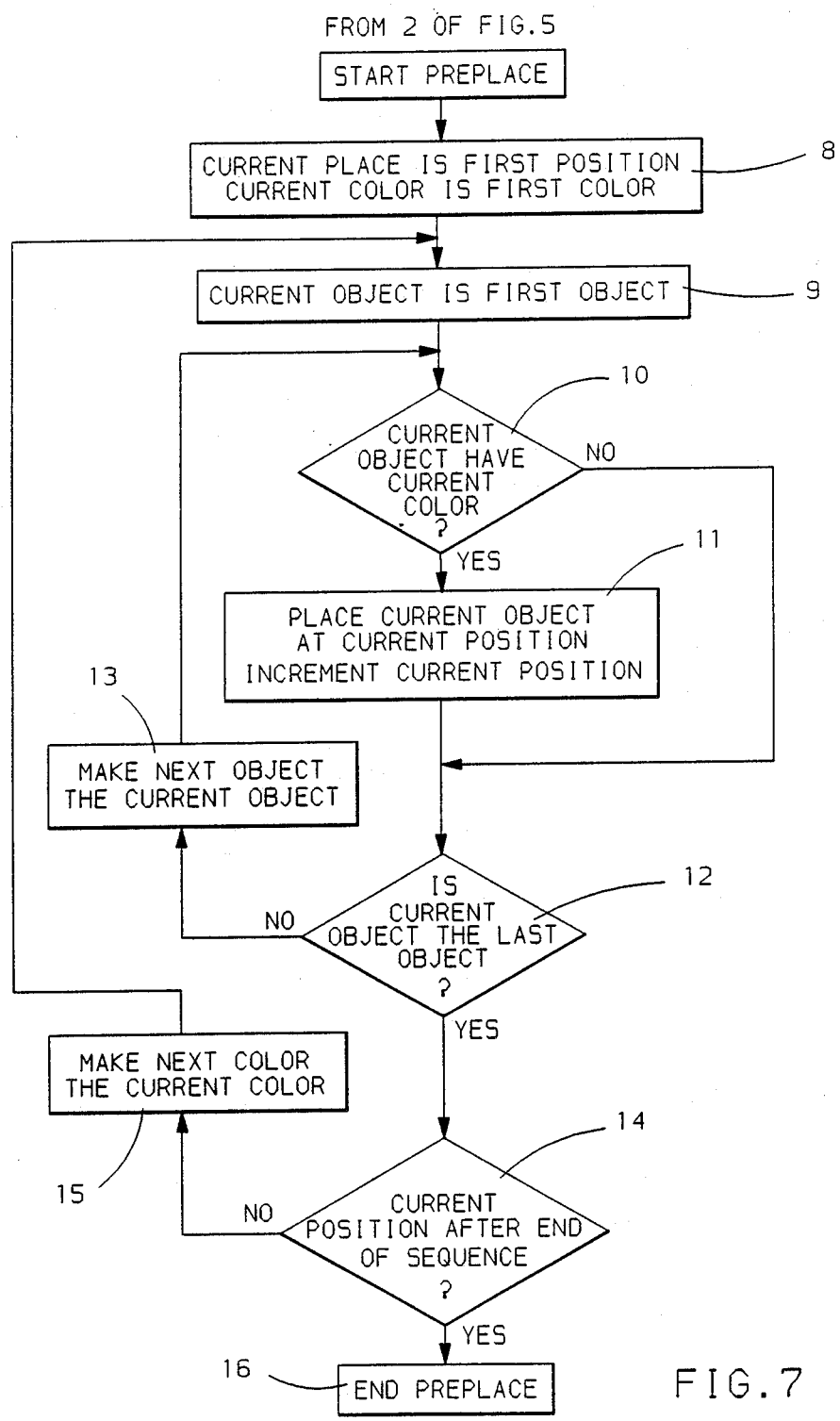

Referring next to FIG. 7, a detailed description of block 2 of FIG. 5 is provided. A functional flow chart of the preplacement step is provided in blocks 8 through 16. From a functional standpoint, the objects are examined in turn for the first color, and placed; then the next color, and placed; and so on, until all objects are placed in an initial configuration.

In FIG. 7 from a serial standpoint the following occurs: The first step 8 is to start the placement at the first position in the sequence, with the first color. Next in step 9 the first object in the set of vehicle descriptions is examined. In step 10, a decision is made as to whether the current object is of the current color; the first time through, the current color is the first color and the current object is the first object, but in subsequent returns from steps 13 or 15 the current object and current color may be changed. If the current object has the current color as an attribute, then step 11 is executed. This places the current object in the current position, and increments the current position so that the next object to be placed will be at the next position. Next, a test is made in step 12 to see if all objects have been examined for the current color. If not, then the next object is made the current object, and the process transfers back to step 10. If all objects have been examined, then a test is made in step 14 to see whether all positions have been placed. If not, then the next color is made the current color to be placed in step 15, and the process continues at step 9. If all objects have been placed, then process continues to step 16 which signals the end of the preplacement process. At this point block 2 of FIG. 5 has been completed, and an initial configuration has been established by the constructive method just defined.

Figure 8:
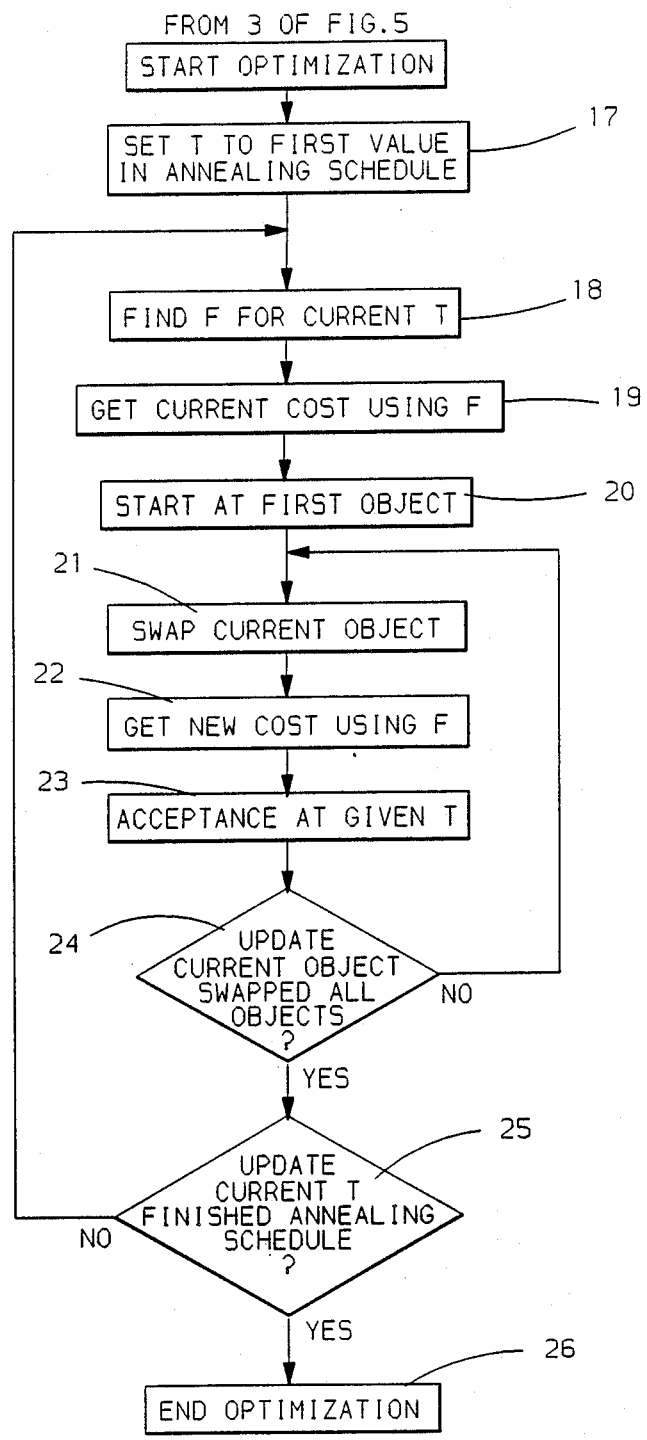

Referring next to FIG. 8, a detailed description of block 3 of FIG. 5 is provided. A functional flow chart of the optimization step is provided in blocks 17 through 26. From a functional standpoint simulated annealing is performed in accordance with the well-known method except that the parameter F is varied in accordance with the invention and used in the calculation of the objective function, or cost, when an evaluation of the scoring function is required by the well-known method.

In FIG. 8 from a serial standpoint, the current value of parameter T is set in step 17 to the initial value of the annealing schedule as determined in step 7 of FIG. 6. Next is step 18 the value of F for the current value of T is determined using the parameters determined in step 7 of FIG. 6. The current cost of the current configuration is determined in step 19. In step 20, the current object at which swaps will be attempted is started at the first object. In step 21, the current object is swapped with another, random, one. In step 22, the cost of the new configuration is determined. The swap undergoes the well-know acceptance procedure in step 23. In step 24 a test is made to see if an attempt has been made to swap all objects. If all objects have not been swapped, the current object to swap is updated to the next one and the process continues at step 21. If an attempt has been made to swap all the objects in the sequence, then a test has been made in test 25 to see if the annealing schedule has been completed. If not, the value of the parameter T is updated and the process continues at step 18. If the annealing schedule has been completed, then the process continues to step 26 which signals the end of the optimization process. At this point block 3 of FIG. 5 has been completed and the configuration is at an optimum.

Figure 9:
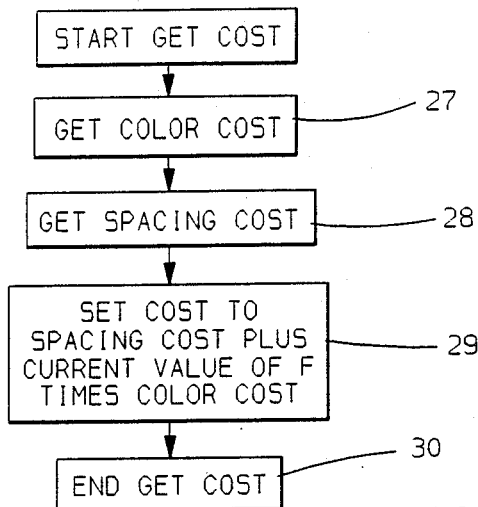

FIG. 9 is a detailed description of the procedure whereby a cost or score is generated in steps 19 or 22 of FIG. 8. From a functional standpoint, the various parts of the cost of objective function are computed, and then are added together with the weight specified by the factor F as determined by the invention.

From a serial standpoint, in step 27 the cost due the first part of the objective function due to the attribute preplaced in FIG. 7, the color, is determined. In step 28, the cost due to the rest of the objective function, the spacing cost, is determined. In step 29 the Value of the color cost, weighted by the current value of the parameter F, as determined in step 18 of FIG. 8, is added to the spacing cost to arrive at the final cost. Step 30 signals the end of the cost computation for the current configuration, and the steps labeled 19 or 22 of FIG. 8 are now completed.

Figure 10:
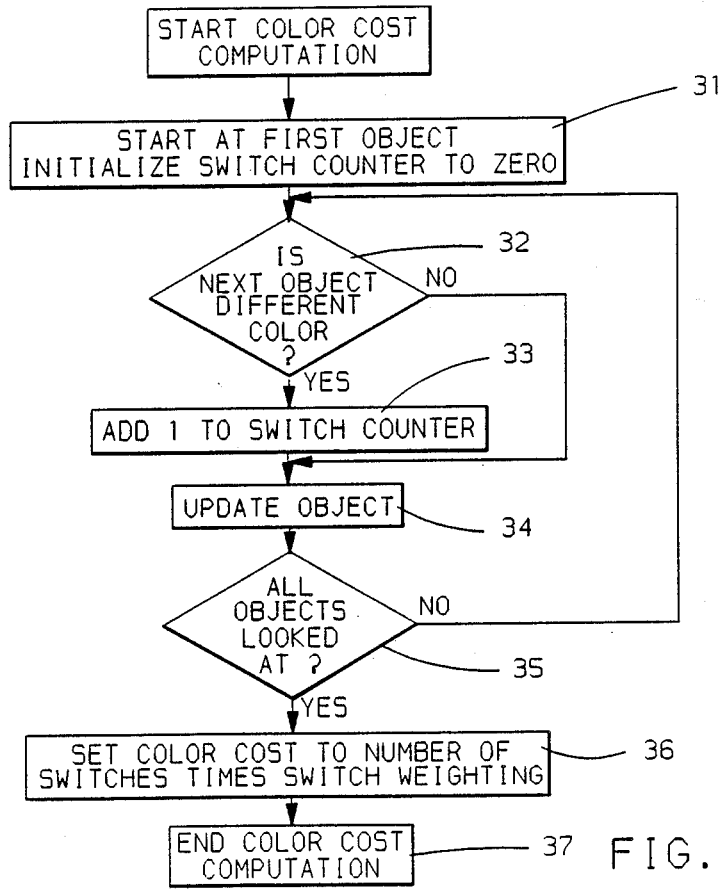

FIG. 10 is a detailed description of the procedure whereby the cost due to the color attribute is determined in step 27 of FIG. 9. From a functional standpoint, the number of times the color attribute changes as one progresses along the sequence is determined, and this number is weighted by the cost for a single color switch, to arrive at the value for the color cost.

From a serial standpoint, in step 31 the current object is set to the first object in the sequence, and the counter that will sum the number of color switches is set to zero. In step 32 a test is made to see if there is a color change from the current object to the next object. If the test is true, the counter is incremented by one in step 33, and the process continues at step 34. If the test is false, then the process is continued at step 34. In step 34, the current object is updated to the next object in the sequence as specified in the current configuration being scored. In step 35, a test is made to see if all objects have been looked at to see of a color switch occurred. If not, then the process continues at step 21. If all objects have been looked at, the process continues at step 36. In step 36 the color cost is set to the value of the counter weighted by the value of a single color switch as determined in step 5 of FIG. 6. Step 37 signals the end of the color cost computation.

Figure 11:
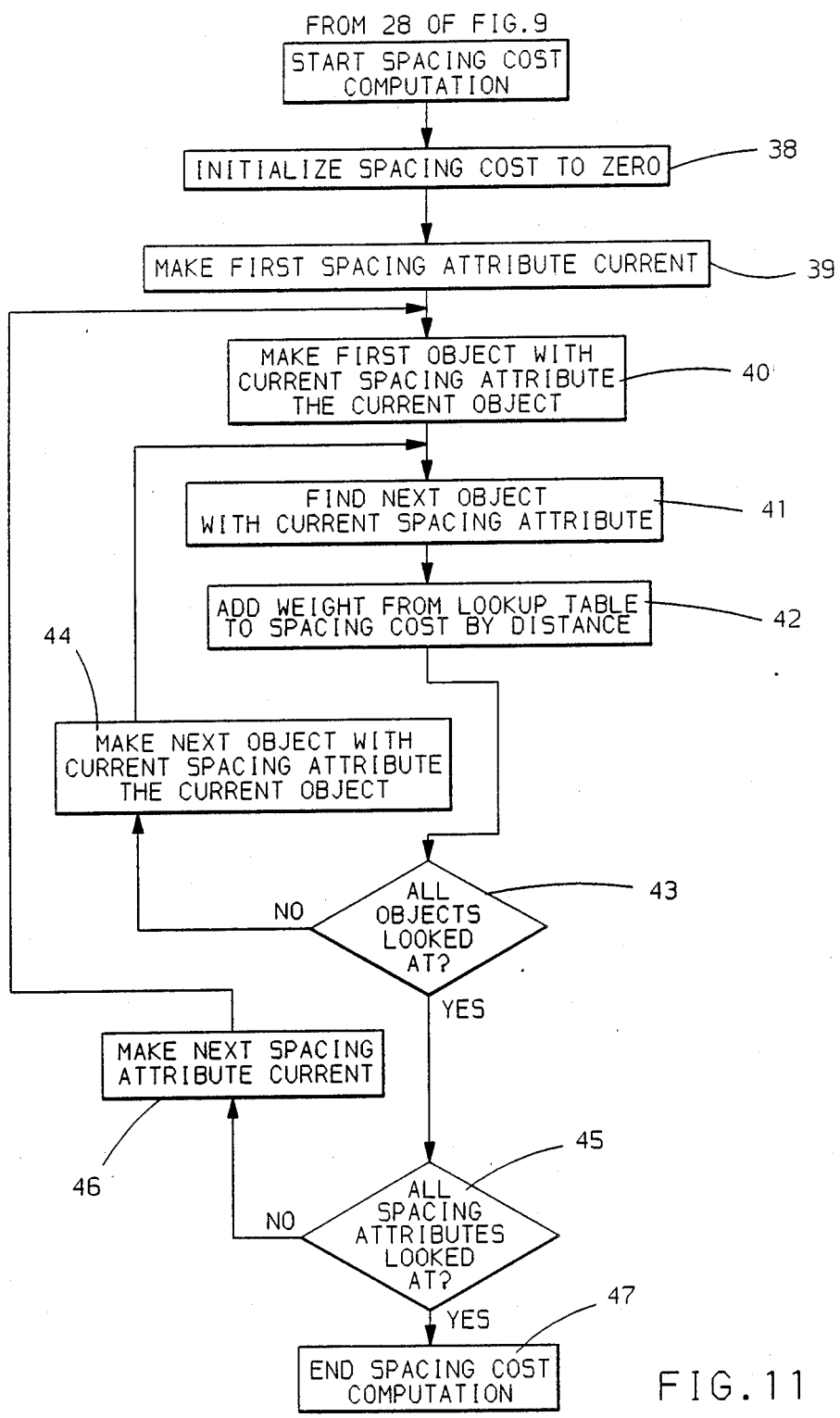

FIG. 11 is a detailed description of the procedure whereby the cost due to the spacing attribute is determined in step 28 of FIG. 9. From a functional standpoint, the distance between successive occurrences of each spacing objective as one progresses along the sequence is determined, and this distance is used of find a cost from a table of cost versus spacing. This cost is summed to find the total spacing cost.

From a serial standpoint, in step 38 the accumulator that will sum the individual contributions to the spacing cost is set to zero. In step 39 the first spacing attribute is made current; the cost due to the current spacing attribute is found in alter steps before proceeding to other spacing attributes. In step 40 the first object with the current spacing attribute is made the current object, and in step 41 the next object, where next means progressing down the sequence determined by the current configuration, is found. In step 42 the distance between the current object and the next object is used to determine the contribution to the spacing cost by examining the lookup table as determined in step 5 of FIG. 6. In step 43 a test is made to determine if all objects have been examined for the current spacing attribute. If not, then the next object, as determined in step 41, is made the current object and the process continues at step 44. If all objects have been examined, then a test is made in step 45 to see if all spacing objectives have been examined. If not, then the next spacing objective is made current in step 46 and the process continues at step 140. If all spacing objectives have been examined, then step 47 signals the end of the spacing cost computation.

Figure 12:
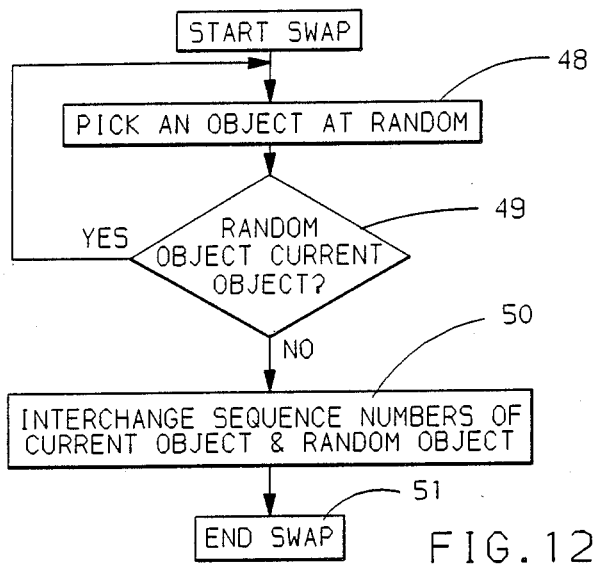

FIG. 12 is a detailed description of the procedure whereby a trial configuration is generated in the swap procedure of step 21 in FIG. 8. From a functional standpoint, a object different from the current object is determined and the positions occupied in the configuration are interchanged.

From a serial standpoint, in step 48 an object is picked at random from the list of objects determined in step 6 of FIG. 6. A test is made in step 49 to see if the random object is the current object. If it yes, then the process continues at step 48, to once again pick a random object. If the random object is different, then the sequence positions of the current object and the random object as defined by the current configuration are interchanged, and step 51 signals the end of the swap procedure.

Figure 13:
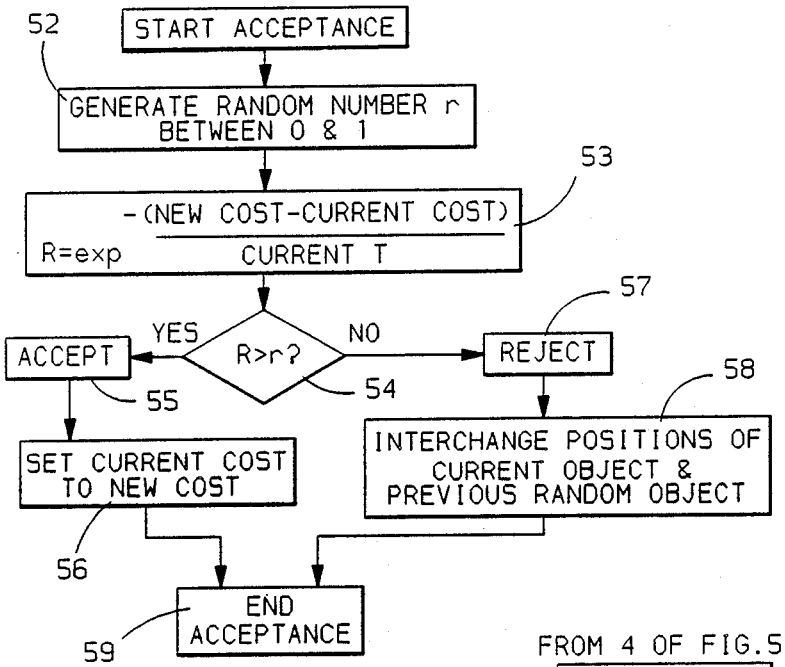

FIG. 13 is a detailed description of the procedure whereby the trail swap generated in step 22 of FIG. 8 is accepted as defining the current configuration in step 23 of FIG. 8. This acceptance procedure follows the well-known method of simulated annealing. From a functional standpoint, the swap is accepted according to the probability determined by the ratio of the change in the temperature-dependent objective function of this invention to the current value of the temperature parameter.

From a serial standpoint, in step 52 a random number r is generated with a value between zero and one and in step 53 there is a computation of the value of R equal to the exponential to the base e of the current value of the temperature-dependent objective function minus the new value of the temperature-dependent objective function, divided by the current value of T, the temperature. The computed value of R is then compared with the value of r from step 52 in step 53 and if R is greater than r, the interchange will be accepted in step 55. The current cost is then set to the value of the new cost in step 56 and the process continues at step 59, signaling the end of the acceptance routine. If the comparison in step 54 shows the value of R is less than the value of r then the interchange is rejected in step 57 and in step 58 the sequence positions are reestablished as they were prior to the interchange determined in the swap step 21 of FIG. 8. The process then continues in step 59, signaling the end of the acceptance routine.

Figure 14:
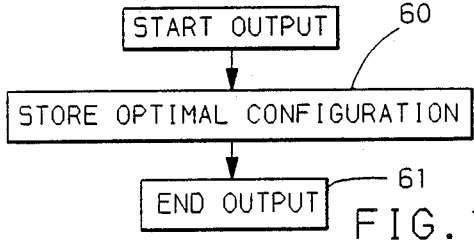

Referring next to FIG. 14, a detailed description of block 4 of FIG. 5 is provided. A functional flow chart of the output step is provided in blocks 60 through 61. From a functional point of view, the final configuration of the optimization procedure is placed in a form usable for actual building of the objects. from a serial standpoint, in step 60 the optimal configuration is placed in a computer file, and the process continues at step 61, which signals the end of the output routine.

The illustrations of FIGS. 5 through 14 may be assembled into a single programming implementation as set forth in Appendix A. The program is written in the FORTRAN language well-known in the art and is within the capabilities of most computers. The particular implementation of is compatible with the SUN Microsystems computers.

APPENDIX A

```
      program main
c
c     lobj is the maximum number of objects
c     lspa is the maximum number of spacing attributes
c
      parameter (lobj=100,lspa=2)
c
      integer cnum(lobj),ccol(lobj)
      logical cspa(lobj,lspa)
      real    objcol,objspa(lobj,lspa)
      real*8  cost,getcst
c
c     files:
c     c_parms            car descriptions
c     objectives         objective parameterizations
c     t_parms            annealing schedule: T, f(T), # passes(T)
c     answer             final solution
c
      open(1,file='c_parms')
      open(2,file='objectives')
      open(3,file='t_parms')
      open(4,file='Answer')
c
c     get objective function descriptions
c
      call reedo(2,lobj,lspa, nspa,objspa,objcol)
c
c     get car descriptions
c
      call reedc(1,lobj,lspa,nspa, n,ccol,cspa)
```

```
c
c         get ti, tf, npass: annealing schedule
c         get tmid, scale, a: objective weighting function (f) parameters
c
          call reedt(3,ti,tf,npass,tmid,scale,a)
c
c         create initial pre-placement in cnum
c
          call place(n,ccol,lobj, cnum)
c
c         perform simulated annealing using modified objective function
c
          call anneal(ti,tf,npass,tmid,scale,a,cnum,
         .             n,lobj, objcol,ccol, lspa,nspa,objspa,cspa)
c
c         write final configuration to file
c
          cost=getcst(1.,cnum, n,lobj,objcol,ccol,lspa,nspa,objspa,cspa)
          call ritec(4,cost,n,cnum,ccol,cspa,lobj,lspa,nspa,
         .             ti,tf,npass,tmid,scale,a)
c
          stop
          end
          subroutine reedo(file,lobj,lspa, nspa,objspa,objcol)
c
c         reedo reads in the objective function parameters
c         and writes them out to unit 6 for documentation
c
c         nspa        is the number of spacing attributes (0<nspa<lspa+1)
c         objcol      is the objective function for switching color
c         objspa(i,ispa) is the objective function for two cars of attribute
c                     ispa spaced i cars apart.  i=1 means back-to-back.
c
          real    objcol,objspa(lobj,lspa)
          integer file
c
c         read in and printout color objective function
c
          rewind file
          read(file,*)objcol
          write(6,'(a)')'1color objective function:'
          write(6,'(a,f8.2,/)')' purge between different colors is',objcol
c
c
```

```
c       nmax is the point where the objective function goes flat;
c       that is, values past nmax are the same as that at nmax
c
        read(file,*)nspa
        write(6,'(a)')' space objective function:'
        do 10 ispa=1,nspa
c
          read(file,*)nmax
          read(file,*)(objspa(i,ispa),i=1,nmax)
          do 20 i=nmax+1,lobj
            objspa(i,ispa)=objspa(nmax,ispa)
   20     continue
c
          write(6,*)
          write(6,*)'attribute ',ispa,' cost versus spacing:'
          write(6,*)(objspa(i,ispa),i=1,nmax)
          write(6,*)'...values subsequent to distance ',nmax,' are the ',
       .            'same as nmax'
c
   10   continue
c
        return
        end
        subroutine reedc(file,lobj,lspa,nspa,n,ccol,cspa)
c
c       reedc reads in the car descriptions file file 'file'.
c       The cars must be in order, and a maximum of lobj cars is imposed
c       silently.
c
c       n         is the number of cars
c       ccol(i)   is the color (1,2,...,ncol) of car i
c       cspa(i,j) is the spacing attribute j (true/false) of car i
c
        integer file
        integer ccol(lobj)
        logical cspa(lobj,lspa)
c
        rewind file
        do 10 i=1,lobj
          read(file,*,end=20)ii,ccol(ii),(cspa(ii,jspa),jspa=1,nspa)
          if(i.ne.ii)stop 1
          n=i
   10   continue
   20 continue
```

```
c
      return
      end
                                    5
      subroutine reedt(file,ti,tf,npass,tmid,scale,a)
c
c     reedt reads in the parameters for the annealing schedule
c           and the parameters for the temperature dependence
c           of the f, part of the objective function
c
c     ti   is the initial temperature parameter
c     tf   is the final   temperature parameter
c     npass is the number of passes to take between ti and tf
c
c     tmid is the temperature midpoint where f=1+a/2
c     a    is the maximum range of f; f(max)=1+a, f(min)=1
c     scale is the scale over which f changes.
c     f=1+a/(1+exp( (tmid-t)/scale ) )
c
      integer file
c
      rewind file
      read(file,*)npass,ti,tf
      read(file,*)a,tmid,scale
c
      return
      end subroutine place(n,ccol,lobj,   cnum)
c
c     init will create an initial sequence in cnum
c     that places all cars with the same ccol in adjacent spots
c
      integer cnum(lobj),ccol(lobj)
c
c     the general strategy is to place cars with ccol=1 first,
c     then those with ccol=2, etc, until all cars are placed.
c
      write(6,'(//,a)')' initial placement:'
      inum =0
      icol =0
      ilast=0
 10   continue
      icol=icol+1
c
```

```
      do 20 iobj=1,n
        if(ccol(iobj).eq.icol)then
          inum=inum+1
          cnum(inum)=iobj
        end if
 20   continue
      write(6,*)inum-ilast,' objects of color ',icol
      ilast=inum
c
      if(inum.lt.n)goto 10
      write(6,*)'initial placement has ',icol,' colors in ',
     .          inum,' objects'
      if(inum.ne.n)stop 2
c
      return
      end subroutine anneal(ti,tf,npass,tmid,scale,a,cnum,
     .                  n,lobj, objcol,ccol, lspa,nspa,objspa,cspa)
c
c     anneal performs the modified simulated annealing
c     that is, with the temperature-dependent objective function
c
      integer cnum(lobj),ccol(lobj)
      logical cspa(lobj,lspa)
      real    objcol,objspa(lobj,lspa)
      real*8  cost,costnw,getcst
      logical accept
c
c     set the initial seed of the random number generator
c
      call srand(123457)
c
c     keep some statistics:
c          kept is the number of accepted swaps
c          itry is the number of attempted swaps
c
      kept=0
c
c     temperature loop:
c     t goes from ti to tf exponentially in npass steps
c
      decay=1.
      if(ti.ne.tf .and. npass.gt.1) decay=alog(ti/tf)/(npass-1)
```

```
c         write(6,'(//,a,/,a)')' progress of optimization:',
                              ' ipass,t,%,f,cost,costnw='
          do 20 ipass=1,npass
             t=ti*exp(-decay*(ipass-1))
c
c
c         calculation of f
c         check to see if we are far from tmid ( in 'scale' units );
c         far means where the exponentional is less than 1E-25
c                 or bigger than 1E25.
c         if so, then just use 1 or 1+a for f (prevent exponential errors)
c
          far=(tmid-t)/scale
          if(far.lt. -58.)then
             f=1.+a
           else if(far.gt. 58.)then
             f=1.
           else
             f=1.+a/(1+exp(far))
          end if
c
c         get the cost of this configuration
c
          cost=getcst(f,cnum, n,lobj,objcol,ccol,lspa,nspa,objspa,cspa)
c
c         do a pass: an attempt to swap each object once with another one
c
          do 10 i=1,n
c
c            random returns a pseudo-random number between 0 and 1
c            so that j is a pseudo-random integer between 1 and n
c
             j=n*random()+1
             if(i.eq.j)goto 10
c
c            swap i and j, find new cost
c
             call swap(i,j,lobj,cnum)
             costnw=getcst(f,cnum,n,lobj,objcol,ccol,lspa,nspa,objspa,cspa)
c
c            check acceptance criterion function
c
c               if true, then update the cost
```

```
c         if false, back out the trial swap
c
          if(accept(t,cost,costnw))then
            if(cost.ne.costnw)kept=kept+1
            cost=costnw
          else
            call swap(i,j,lobj,cnum)
          end if
          itry=itry+1
c
   10   continue
c
c       write out progress of calculation
c
        if(mod(ipass,10).eq.0)then
          costnw=getcst(1.,cnum,n,lobj,objcol,ccol,
     .                  spa,nspa,objspa,cspa)
          write(6,1)ipass,t,100.*float(kept)/itry,f,cost,costnw
    1     format(1x,i4,f8.2,0pf6.1,3f8.2)
          kept=0
          itry=0
        end if
   20 continue
c
      return
      end real*8 function getcst(f,cnum,
     .                  n,lobj,objcol,ccol,lspa,nspa,objspa,cspa)
c
c     getcst returns the value of the tmeperature-dependent
c     objective function specified by the configuration in cnum
c     the value of f, and the parameters in objcol and objspa.
c
      integer cnum(lobj),ccol(lobj)
      logical cspa(lobj,lspa)
      real    objcol,objspa(lobj,lspa)
c
      real*8 costc,costs
c
      costc=0.d0
      costs=0.d0
c
c     find the color switches, sum into costc weighted by objcol
```

```
c
      iswit=0
      do 10 i=1,n-1
        iobj=cnum(i)
        jobj=cnum(i+1)
        if(ccol(iobj).ne.ccol(jobj))iswit=iswit+1
10    continue
      costc=iswit*objcol
c
c     calculate the spacing costs, sum into costs
c     loop over the spacing attributes kspa=1,...,nspa
c
      do 20 kspa=1,nspa
c
c     for each object with the attribute, we know where the last
c     object that had that attribute was, so the objective function
c     is a table lookup on the distance betwen the two.
c     start with last=0; last will hold the place of the last object
c     with the kps attribute.
c
      last=0
c
      do 30 i=1,n
        iobj=cnum(i)
        if(cspa(iobj,kspa))then
          if(last.ne.0)costs=costs+objspa(i-last,kspa)
          last=i
        end if
30    continue
c
20    continue
c
c     now weight the color cost by f and add to the spacing cost
c
      getcst=f*costc+costs
c
      return
      end real function random()
c
c     random is a psudo-random number generator that returns
c     a value between 0 and 1, evenly distributed.
c     another entry point is srand, which sets the initial seed
```

```
c
      real*8 seed
      common /seedy/seed
c
      seed=dmod(16807.d0*seed,2147483647.d0)
      random=sngl(seed/2147483648.d0)
      return
c
      entry srand(i)
      seed=i
      return
c
      end subroutine swap(i,j,lobj,cnum)
c
c     swap will swap the order of i and j in cnum
c     this generates a new sequence
c
      integer cnum(lobj)
c
      ii=cnum(i)
      cnum(i)=cnum(j)
      cnum(j)=ii
c
      return
      end logical function accept(t,cost,costnw)
c
c     accept will tell whether or not to accept a change in the
c     objective function from cost to costnw, given a temperature
c     value of t
c
      real*8 cost,costnw
c
c     the default value is false.
c     then we only need to say when we accept the move.
c
      accept=.false.
c
c     if the new cost is less then the old cost, accept.
c
      if(costnw.le.cost)then
        accept=.true.
```

```
      else
c
c       check the exponential of the cahnge in cost over the t parameter
c       and accept with this probability.
c       to avoid overflows, don't calculate the expontial of a number
c       greater than 100; this eliminates swaps whose probability
c       of acceptance is less than one in 10**43.
c
        dovert=(costnw-cost)/t
        if(dovert.lt.100.)then
           if(exp(-dovert).lt.random())accept=.true.
        end if
c
      end if
c
      return
      end subroutine ritec(file,cost,n,cnum,ccol,cspa,lobj,lspa,nspa,
     .                 ti,tf,npass,tmid,scale,a)
c
c     ritec will output the final result into the bottom of unit file
c     and the printout.
c
      integer file
      real*8 cost
      integer cnum(lobj),ccol(lobj)
      logical cspa(lobj,lspa)
      character*1 dummy
c
c     skip to the bottom of the file
c
      rewind file
    1 read(file,'(a)',end=2)dummy
      goto 1
    2 continue
c
      write(6,'(//,a)')' final configuration:'
      write(  6,3)n,nspa,cost,npass,ti,tf,tmid,scale,a
      write(  6,4)(    cnum(i)  ,i=1,n)
      write(  6,4)(ccol(cnum(i)),i=1,n)
      do 10 k=1,nspa
         write(  6,5)(cspa(cnum(i),k),i=1,n)
   10 continue
```

```
c
      write(file,3)n,nspa,cost,npass,ti,tf,tmid,scale,a
      write(file,4)(       cnum(i)  ,i=1,n)
      write(file,4)(ccol(cnum(i)),i=1,n)
      do 20 k=1,nspa
         write(file,5)(cspa(cnum(i),k),i=1,n)
   20 continue
c
    3 format(/,' n=',i5,' nspa=',i5,' cost=',e16.8,
     .      /,' npass=',i7,' ti=',e16.8,' tf=',e16.8,
     .      /,' tmid=',e16.8,' scale=',e16.8,' a=',e16.8,/)
    4 format(40i2)
    5 format(40(1x,l1))
c
      return
      end
``` color objective function:
purge between different colors is    10.00 space objective function:

attribute    1    cost versus spacing:
  15.00000    4.000000    3.000000    2.000000    1.000000
 ...values subsequent to distance    5    are the    same as nmax initial placement:
   10    objects of color    1
   10    objects of color    2
   10    objects of color    3
   10    objects of color    4
 initial placement has    4    colors in    40    objects progress of optimization:
ipass,t,%,f,cost,costnw=
   10    0.90    4.6    100.00    3093.00    123.00
   20    0.80    4.8    100.00    3102.00    132.00
   30    0.72    3.6    100.00    3091.00    121.00
   40    0.64    5.2    100.00    3113.00    143.00
   50    0.57    5.8    100.00    3092.00    122.00
   60    0.51    5.1    100.00    3093.00    123.00
   70    0.45    5.6    100.00    3091.00    121.00

| | | | | | |
|---|---|---|---|---|---|
| 80 | 0.40 | 5.2 | 100.00 | 3072.00 | 102.00 |
| 90 | 0.36 | 5.9 | 100.00 | 3091.00 | 121.00 |
| 100 | 0.32 | 3.3 | 100.00 | 3104.00 | 134.00 |
| 110 | 0.28 | 3.6 | 100.00 | 3102.00 | 132.00 |
| 120 | 0.25 | 5.9 | 100.00 | 3092.00 | 122.00 |
| 130 | 0.23 | 5.4 | 100.00 | 3112.00 | 142.00 |
| 140 | 0.20 | 4.8 | 100.00 | 3071.00 | 101.00 |
| 150 | 0.18 | 3.3 | 100.00 | 3093.00 | 123.00 |
| 160 | 0.16 | 2.8 | 100.00 | 3113.00 | 143.00 |
| 170 | 0.14 | 6.1 | 100.00 | 3103.00 | 133.00 |
| 180 | 0.13 | 4.7 | 100.00 | 3112.00 | 142.00 |
| 190 | 0.11 | 6.2 | 100.00 | 3092.00 | 122.00 |
| 200 | 0.10 | 3.3 | 100.00 | 3081.00 | 111.00 |
| 210 | 0.09 | 0.3 | 100.00 | 3082.00 | 112.00 |
| 220 | 0.08 | 0.8 | 100.00 | 3061.00 | 91.00 |
| 230 | 0.07 | 0.0 | 100.00 | 3061.00 | 91.00 |
| 240 | 0.06 | 0.3 | 100.00 | 3051.00 | 81.00 |
| 250 | 0.06 | 0.0 | 1.00 | 81.00 | 81.00 |
| 260 | 0.05 | 0.0 | 1.00 | 81.00 | 81.00 |
| 270 | 0.05 | 0.5 | 1.00 | 81.00 | 81.00 |
| 280 | 0.04 | 0.3 | 1.00 | 77.00 | 77.00 |
| 290 | 0.04 | 0.0 | 1.00 | 77.00 | 77.00 |
| 300 | 0.03 | 0.0 | 1.00 | 77.00 | 77.00 |
| 310 | 0.03 | 0.0 | 1.00 | 77.00 | 77.00 |
| 320 | 0.03 | 0.0 | 1.00 | 77.00 | 77.00 |
| 330 | 0.02 | 0.0 | 1.00 | 77.00 | 77.00 |
| 340 | 0.02 | 0.0 | 1.00 | 77.00 | 77.00 |
| 350 | 0.02 | 0.0 | 1.00 | 77.00 | 77.00 |
| 360 | 0.02 | 0.0 | 1.00 | 77.00 | 77.00 |
| 370 | 0.01 | 0.0 | 1.00 | 77.00 | 77.00 |
| 380 | 0.01 | 0.0 | 1.00 | 77.00 | 77.00 |
| 390 | 0.01 | 0.0 | 1.00 | 77.00 | 77.00 |
| 400 | 0.01 | 0.0 | 1.00 | 77.00 | 77.00 | final configuration:

n=   40 nspa=    1 cost=  0.77000000e+02
npass=   400 ti=  0.10000000e+01 tf=  0.99999998e-02
tmid=  0.59999999e-01 scale=  0.99999997e-04 a=  0.99000000e+02

13 4 7 5 2 9 3 8 6 11015181217141911201629242822302126232725403639333732343538 3
 2 1 1 1 1 1 1 1 1 1 2 2 2 2 2 2 2 2 2 3 3 3 3 3 3 3 3 3 3 4 4 4 4 4 4 4 4 4 4
 t f f f f f f f f f t f t f t f t f t f t f t f t f t f t f f f f f f f f f f

Having described our invention what we claim is:

1. A method of scheduling the build sequence of a plurality of objects on an assembly line in order to minimize the cost of building the objects, each object having a plurality of attributes, which together with the position of the object in the sequence, affect the overall cost of the build sequence:

comprising the steps of;
   (a) providing a computer with a representation of the object, its attributes, and a procedure for calculating the cost associated with any arrangement of the attributes,
   (b) generating an initial build sequence using the representation of step (a) which has a miminal cost associated with the arrangement of at least one of said attributes,
   (c) generating a final build sequence in accordance with a simulated annealing algorithm which utilizes a scoring function that includes the costs defined by the procedure of step (a), those costs associated with the attributes of step (b) being independently weighted in accordance with a temperature varying function,
   (d) providing a representation of the final build sequence usable for construction of the objects.

2. A method of scheduling the build sequence of a plurality of vehicles on an assembly line in order to minimize the cost of building the vehicles, each vehicle having a plurality of attributes, which together with the position of the vehicle in the sequence, affect the overall cost of the build sequence:

comprising the steps of;
   (a) providing a computer with a representation of the vehicle, its attributes, and a procedure for calculating the cost associated with any arrangement of the attributes,
   (b) generating an initial build sequence using the representation of step (a) which has a miminal cost associated with the arrangement of at least one of said attributes,
   (c) generating a final build sequence in accordance with a simulated annealing algorithm which utilizes a scoring function that includes the costs defined by the procedure of step (a), those costs associated with the attributes of step (b) being independently weighted in accordance with a temperature varying function,
   (d) providing a representation of the final build sequence usable for construction of the vehicles.

3. A method of scheduling the build sequence of a plurality of vehicles on an assembly line in order to minimize the cost of building the vehicles, each vehicle having a plurality of attributes, one of which is color, which together with the position of the vehicle in the sequence, affect the overall cost of the build sequence:

comprising the steps of;
   (a) providing a computer with a representation of the vehicle, its attributes, and a procedure for calculating the cost associated with any arrangement of the attributes,
   (b) generating an initial build sequence using the representation of step (a) which has a miminal cost associated with placing the color attribute,
   (c) generating a final build sequence in accordance with a simulated annealing algorithm which utilizes a scoring function that includes the costs defined by the procedure of step (a), those costs associated with the attribute color being independently weighted in accordance with a temperature varying function,
   (d) providing a representation of the final build sequence usable for construction of the vehicles.

4. A method of scheduling the build sequence of a plurality of objects in order to minimize the cost of building the objects, each object having a plurality of attributes, which together with the position of the object in the sequence, affect the overall cost of the build sequence:

comprising the steps of;
   (a) providing a computer with a representation of the object including its attributes, and a procedure for calculating the cost associated with any arrangement of the attributes,
   (b) generating an initial build sequence using the representation of step (a) which has a minimal cost associated with the arrangement of at least one of said attributes,
   (c) generating a final build sequence in accordance with a simulated annealing algorithm which utilizes a scoring function that includes the costs defined by the procedure of step (a), those costs associated with the attributes of step (b) being independently weighted in accordance with a temperature varying function,
   (d) providing a representation of the final build sequence usable for construction of the objects.

5. A method of scheduling the build route of a plurality of components in an assembly plant in order to minimize the cost of building the components, each component having a plurality of attributes, which together with the position of the component in the route, affect the overall cost of the build route:

comprising the steps of;
   (a) providing a computer with a representation of the component including its attributes, and a procedure for calculating the cost associated with any arrangement of the attributes,
   (b) generating an initial build route using the representation of step (a) which has a minimal cost associated with the arrangement of at least one of said attributes,
   (c) generating a final build route in accordance with a simulated annealing algorithm which utilizes a scoring function that includes the costs defined by the procedure of step (a), those costs associated with the attributes of step (b) being independently weighted in accordance with a temperature varying function,
   (d) providing a representation of the final build route usable for construction of the components.

* * * * *